(12) United States Patent
Handshoe

(10) Patent No.: US 9,991,694 B1
(45) Date of Patent: Jun. 5, 2018

(54) MULTI-CHANNEL TONE MONITOR SYSTEM AND METHOD FOR GROUND WIRE MONITORING USING SAME

(71) Applicant: Becker Mining America, Inc., Huntington, WV (US)

(72) Inventor: Sam Handshoe, Cattlettsburg, KY (US)

(73) Assignee: Becker Mining America, Inc., Huntington, WV (US)

( * ) Notice: Subject to any disclaimer, the term of this patent is extended or adjusted under 35 U.S.C. 154(b) by 410 days.

(21) Appl. No.: 14/922,133

(22) Filed: Oct. 24, 2015

Related U.S. Application Data

(60) Provisional application No. 62/068,941, filed on Oct. 27, 2014.

(51) Int. Cl.
*H02H 3/33* (2006.01)
*G01R 31/02* (2006.01)

(52) U.S. Cl.
CPC ............. *H02H 3/33* (2013.01); *G01R 31/025* (2013.01)

(58) Field of Classification Search
CPC ................................ H02H 3/33; G01R 31/025
See application file for complete search history.

(56) References Cited

U.S. PATENT DOCUMENTS

| | | | |
|---|---|---|---|
| 4,075,675 A | 2/1978 | Burkett et al. | |
| 4,153,923 A | 5/1979 | Graf | |
| 4,368,498 A | 1/1983 | Neuhouser | |
| 4,529,929 A | 7/1985 | Berggren | |
| 6,327,124 B1 | 12/2001 | Fearing et al. | |
| 6,396,284 B1* | 5/2002 | Tisdale | G01R 27/205 |
| | | | 324/525 |
| 6,631,063 B2* | 10/2003 | Ortiz | H02H 3/38 |
| | | | 361/79 |
| 7,301,739 B2* | 11/2007 | Hamer | H02H 3/165 |
| | | | 361/42 |
| 8,537,516 B1* | 9/2013 | Chelcun | H02J 3/00 |
| | | | 361/42 |
| 2009/0256576 A1* | 10/2009 | Weems, II | G01R 31/025 |
| | | | 324/520 |
| 2014/0153142 A1* | 6/2014 | Callsen | G01R 31/025 |
| | | | 361/42 |

* cited by examiner

*Primary Examiner* — Scott Bauer
(74) *Attorney, Agent, or Firm* — Phyllis K Wood; PK Wood Law Office

(57) ABSTRACT

Methods and systems for a ground wire tone monitor, a multi-channel open loop ground wire tone monitoring system, and method for monitoring two or more ground wires in a power distribution system. A tone monitor includes a transmitter assembly and a receiver assembly. The receiver assembly on the power center communicates with the transmitter assembly on the machine side through a ground wire, so that this ground wire can be directly monitored, the location of the receiver and transmitter interchangeable. The multi-channel system includes up to 16-standalone tone monitor pairs used together to form a multi-channel system. Each tone monitor pair forms one channel in the multi-channel system and each channel operates on a unique preselected frequency. Filters are used to pass signals through to the receivers; the Amplitude of the signal is used to calculate the resistance of the ground wire.

20 Claims, 5 Drawing Sheets

| Switch | Channel number | Operating Signal Frequency(KHz) |
|---|---|---|
|  | 1 | 2 |
|  | 2 | 4 |
|  | 3 | 6 |
|  | 4 | 8 |
|  | 5 | 10 |
|  | 6 | 12 |
|  | 7 | 14 |
|  | 8 | 16 |
|  | 9 | 18 |
|  | 10 | 20 |
|  | 11 | 22 |

| | | |
|---|---|---|
|  | 12 | 24 |
|  | 13 | 26 |
|  | 14 | 28 |
|  | 15 | 30 |
|  | 16 | 32 |

MULTI-CHANNEL TONE MONITOR SYSTEM AND METHOD FOR GROUND WIRE MONITORING USING SAME

This application claims the benefit of priority to U.S. Provisional Application No. 62/068,941 filed on Oct. 27, 2014.

FIELD OF THE INVENTION

This invention relates to ground wire monitoring, and in particular, to methods, systems, and devices for a multi-channel tone monitoring system using ground wire signal transmission to monitor the integrity of the ground circuit of power distribution circuits.

BACKGROUND AND PRIOR ART

U.S. Pat. No. 4,153,923 discloses continuity testing of at least one ground wire of a cable connected between a power center and a load. The power system couples a signal to multi-phase conductors through a multi-phase power filter, and at the load the signal is coupled to the ground wire through another multi-phase power filter. The signal returns through the ground wire where a current transformer couples the signal to a receiver. A decrease in amplitude or frequency beyond a preset threshold opens a circuit breaker and cuts off power to the load. Similarly, U.S. Pat. No. 4,075,675 transmits a signal over the ground conductor. A receiver receives the transmitted signal and when the signal is absent, a circuit breaker is opened. Signal transmission over two or more ground wires is subject to cross talk.

Like the '923 patent, U.S. Pat. No. 4,368,498 requires a closed loop and is limited to detection of interruption of the monitor signal. Of interest patents include ground fault detection system, and methods described in U.S. Pat. No. 4,529,929 which measure ground fault current and U.S. Pat. No. 6,327,124 where motor circuit insulation failure is detected prior to applying power.

What is needed to overcome the problems associated with prior art monitors is a tone monitoring system that does not require a closed loop system with a multi-channel grounding system, the system channel detecting the frequency of each load used in a multi-channel system to monitor plural ground, eliminating frequency crosstalk occurring in prior art systems. Additionally, the system channel detecting the frequency of each load used in a multi-channel system to monitor plural ground circuits notifying the other channels to disregard the connected load frequency.

SUMMARY OF THE INVENTION

A primary objective of the present invention is to provide methods, systems and devices for a Tone Monitor designed to monitor the integrity of the ground circuit of power distribution circuits (applies to Low, Medium and High voltage power systems) that eliminates the three-phase power filters or pilot wire filters associated with the existing tone monitors.

A secondary objective of the present invention is to provide methods, systems and devices for a ground monitor using different tones to easily perform multi-channel monitoring of two or more ground lines between the power center and two or more loads, or load side equipment.

A third objective of the present invention is to provide methods, systems and devices for a Tone Monitor that monitors the integrity of the ground circuit using a transmitter assembly on the machine sided and a receiver assembly at the power center that communicate through a ground wire, so that this ground wire can be directly monitored, the location of the transmitter and receiver being interchangeable.

A fourth objective of the present invention is to provide methods, systems and devices for a multi-channel ground monitoring system using up to 16 standalone tone monitor channels.

A first embodiment is an open loop ground wire tone monitor including a transmitter assembly connectable with one single electrical distribution system ground wire to inject a ground monitor signal onto the ground wire at intervals, the transmitter assembly including a first channel selection, locally or remotely controlled with each channel corresponding to a preset channel frequency and plural output filters each corresponding to one of the channel frequencies, the transmitter assembly automatically activating the one of plural filters corresponding to the selected channel frequency to pass the ground wire monitor signal of the selected channel frequency onto the ground wire and a receiver assembly connectable to an opposite end of the one single electrical distribution system ground wire and a current transformer coupled with the ground wire to sense the transmitted ground monitor signal, the receiver assembly having a second channel selection switch for selecting the channel set at the transmitter assembly and plural input filters each corresponding to one of the channels, the transmitter assembly automatically activating the input filter corresponding to the set channel to pass the received ground monitor signal to the receiver microcontroller to calculate a ground wire resistance from the received ground monitor signal and outputting a ground wire status signal based on the calculated resistance.

A second embodiment is a multi-channel ground wire monitor system that includes multiple different tone monitor pairs each having a receiver assembly and a transmitter assembly, each one of the multiple tone monitor pairs set to transmit and receive a different frequency tone monitor signal and one single grounding wire system connected between the multiple receiver assemblies and the multiple transmitter assemblies such that the multiple frequency tone monitor signals are transmitted via the one single grounding wire system.

Another embodiment is a multi-channel ground wire monitor system that uses load recognition with multiple different tone monitor pairs each having a receiver assembly and a transmitter assembly each set to transmit and receive a different digital bit word code and one single grounding wire system connected between the multiple receiver assemblies and the multiple transmitter assemblies such that the different digital bit word codes are transmitted via the one single grounding wire system.

Further objects and advantages of this invention will be apparent from the following detailed description of preferred embodiments which are illustrated schematically in the accompanying drawings.

BRIEF DESCRIPTION OF THE FIGURES

FIG. 5b is a continuation of the table shown in FIG. 5a.

DESCRIPTION OF THE PREFERRED EMBODIMENTS

Before explaining the disclosed embodiments of the present invention in detail it is to be understood that the invention is not limited in its application to the details of the particular arrangements shown since the invention is capable of other embodiments. Also, the terminology used herein is for the purpose of description and not of limitation.

In the Summary above and in the Description of Preferred Embodiments and in the accompanying drawings, reference is made to particular features (including method steps) of the invention. It is to be understood that the disclosure of the invention in this specification includes all possible combinations of such particular features. For example, where a particular feature is disclosed in the context of a particular aspect or embodiment of the invention, that feature can also be used, to the extent possible, in combination with and/or in the context of other particular aspects and embodiments of the invention, and in the invention generally.

In this section, some embodiments of the invention will be described more fully with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will convey the scope of the invention to those skilled in the art. Like numbers refer to like elements throughout, and prime notation is used to indicate similar elements in alternative embodiments.

Figure 1:
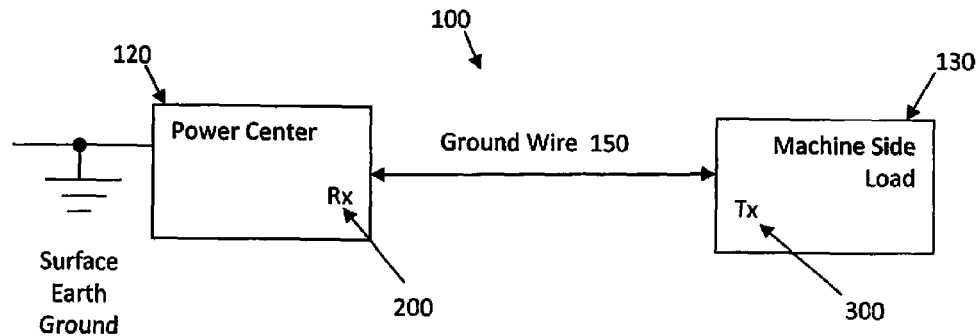
FIG. 1 is a system block diagram for monitoring two or more ground wires between a power system and two or more different loads.

The tone monitor of the present invention is designed to monitor the integrity of the ground circuit of power distribution circuits in industrial environments, and in particular, in above ground, and below ground mines such as mines where there is only a single point of earth ground for the entire electrical system. The tone monitor eliminates the three-phase filters or pilot wire filters associated with the existing tone monitors, so that it is easy to perform multi-channel monitoring. The tone monitor can be used for any power systems, including low voltage, medium voltage, and high voltage. FIG. 1 is a block diagram of a tone monitor pair 100 for monitoring a ground wire 150 between a power center source 200 and a machine side load 300.

Abbreviations used in the drawings and the following description include:
CT Current Transformer
LC Inductor/Capacitor filter
PLC/μC Controller module
PMW Pulse Width Modulation The term "tone" and "frequency" are used interchangeably.

A tone monitor pair 100 includes a transmitter assembly 300 and a receiver assembly 200. In the example described below the receiver assembly 200 on the power center 120 communicates with the transmitter assembly 300 on the machine side load 130 through a ground wire 150, so that the ground wire can be directly monitored. Alternatively, the transmitter may be in the power center and the receiver on the machine side (load). Up to 16 standalone tone monitor pairs can be used together to form a multi-channel system. The tone monitor system of the present invention eliminates frequency crosstalk occurring in prior art legacy systems.

Each tone monitor pair 100 forms one channel in the multi-channel system and each channel operates on a unique preselected signal frequency $f_N$. (Inductor/Capacitor) (LC) filters pass signals through the receivers LC filter and the frequency of the signal is used to calculate the resistance of the ground wire for the tone monitor pair ground wire.

LC filters with resonant frequencies equal to the preselected channel frequency are activated within this channel's transmitter and receiver. Only a received signal with this unique preselected frequency passes through the receiver's LC filter for this channel is processed by the receiver, and used to calculate the resistance value of this channel's ground wire. Other received signals at different frequencies do not pass through this receiver's LC filter and are not processed by this channel. Using different signal frequencies for each channel's receiver prevents cross talk between multiple channels.

The LC filter used can take one of many different forms, for example, a phase filter is one kind of LC filter that uses high voltage rated components to transmit the signals from the Tone Monitor device to the three phase power conductors, or transfer the signals from the power lines to the ground wire. The tone monitor system of the present invention transmits and receives the signals to and from the ground wire. By transmitting and receiving signals to and from the ground wire, low voltage rated components can be used to form LC filters. These LC filters are embedded in the transmitters and receivers, and are selectable by the microcontrollers to operate on the assigned channel frequencies.

The tone monitor system of the present invention is especially useful in the mining industry where the mining electrical system has only one single ground point with all other grounding points daisy chained together. Each ground in the tone monitor system is assigned a different tone (frequency $f_N$). The system transmits multiple tones through the grounding wire system and each different tone is received by only one receiver (power center or load side) having an LC filter that matches that particular assigned tone.

Applications using the tone monitor include a standalone pair and up to, but not limited to 16 multi-channel system using two assemblies for each standalone pair: one transmitter assembly, and one receiver assembly. The tone monitor system described below is expandable to sixteen (16) different operating signal frequencies.

Figure 2:
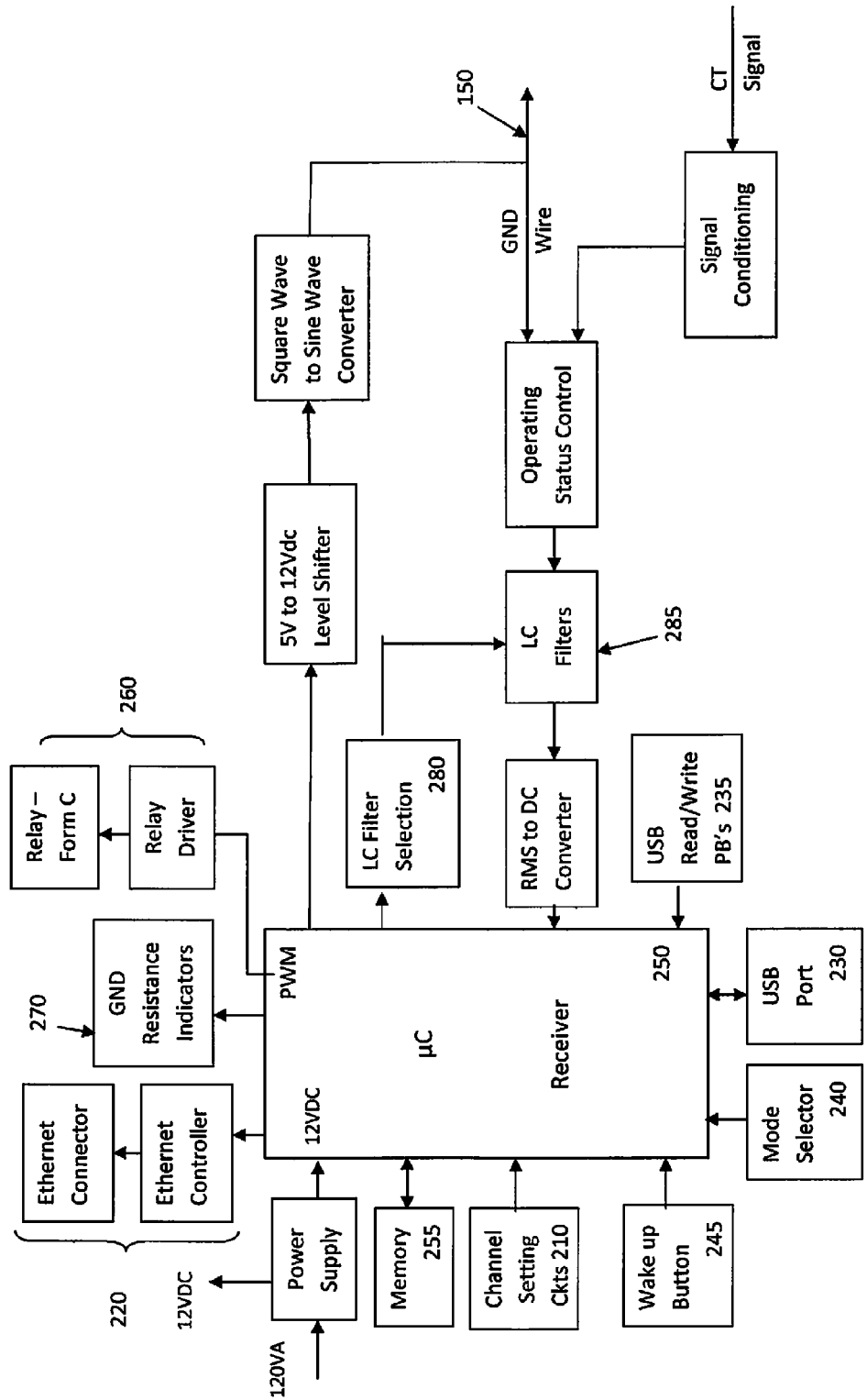
FIG. 2 is a schematic block diagram showing an example of a receiver side of the tone monitor system.

FIG. 2 is a schematic block diagram showing an example of a receiver 200 of the tone monitor system. Each receiver assembly 200 can include a four-position DIP switch 210 is used to set the channel number and the corresponding operating signal frequency (tone) of the particular tone monitor pair. The microcontroller sets the LC filter selection 280 to correspond to the position of the DIP switch 210 which enable one of the plural different LC filters. Two Ethernet connectors 220 are used to form the network and communicate with the remotely located PLC controller module (not shown). A USB port 230 is provided for firmware self-upgrading and stored data reading and two pushbutton switches 235 connected with the USB port 230 are used for selecting the read write function of the USB port. A mode selector switch 240, a three position rotary switch in this example, is used to set the operating mode to one of Normal, Open Ground Circuit Test, or Short Monitor Input Test, and a single wake up switch 245 can be used to wake the transmitter from the sleep mode.

As shown, a relay driver and a form C relay 260 are provided to automatically open the circuit when a serious fault is detected. The Form C Relay shown in FIG. 2 can be de-energized or energized according to the calculated ground wire resistance value. Indicators 270 are used to indicate when the tone monitor is active (ON), ground wire resistance indicators can be used to display status of the ground wire cable and can include a ground wire broken indicator.

The receiver microcontroller includes memory 255 for storing data. The receiver continuously calculates the resistance of the ground wire and the ground wire resistance value is saved in memory every 5 minutes, for up to 24 hours. Additionally, up to 2000 circuit breaker/interrupter trip events can be recorded by the trip event types such as ground wire broken, low ground wire resistance, and the like, and can include date and or time stamps.

As FIG. 2 shows, the receiver power supply circuit uses 120 VAC to generate 5 VDC and 12 VDC. The 5 VDC is used to supply the microcontroller and its peripheral circuits. The 12 VDC is used for the interface circuits connected with the ground wire and the current transformer CT.

One or more pilot interlock pins can be used to assure that the power center circuit breaker feeding the particular machine (load) circuit is open prior to the power connector being removed. This can be accomplished by opening the pilot circuit, interrupting the under voltage release on the circuit breaker before the power conductor pins break contact. Opening the circuit breaker prior to the pilot interlock pins and, thus, the circuit breaker prevents the user from being exposed to an arc flash by disconnecting an energized connector.

The receiver assembly receives the signal from the ground wire, only if it is in sleep mode. Only the sine wave with the resonant frequency of the selected LC filter 285 can pass through the LC filter. The RMS signal is converted to DC, to wake up the microcontroller.

Figure 3:
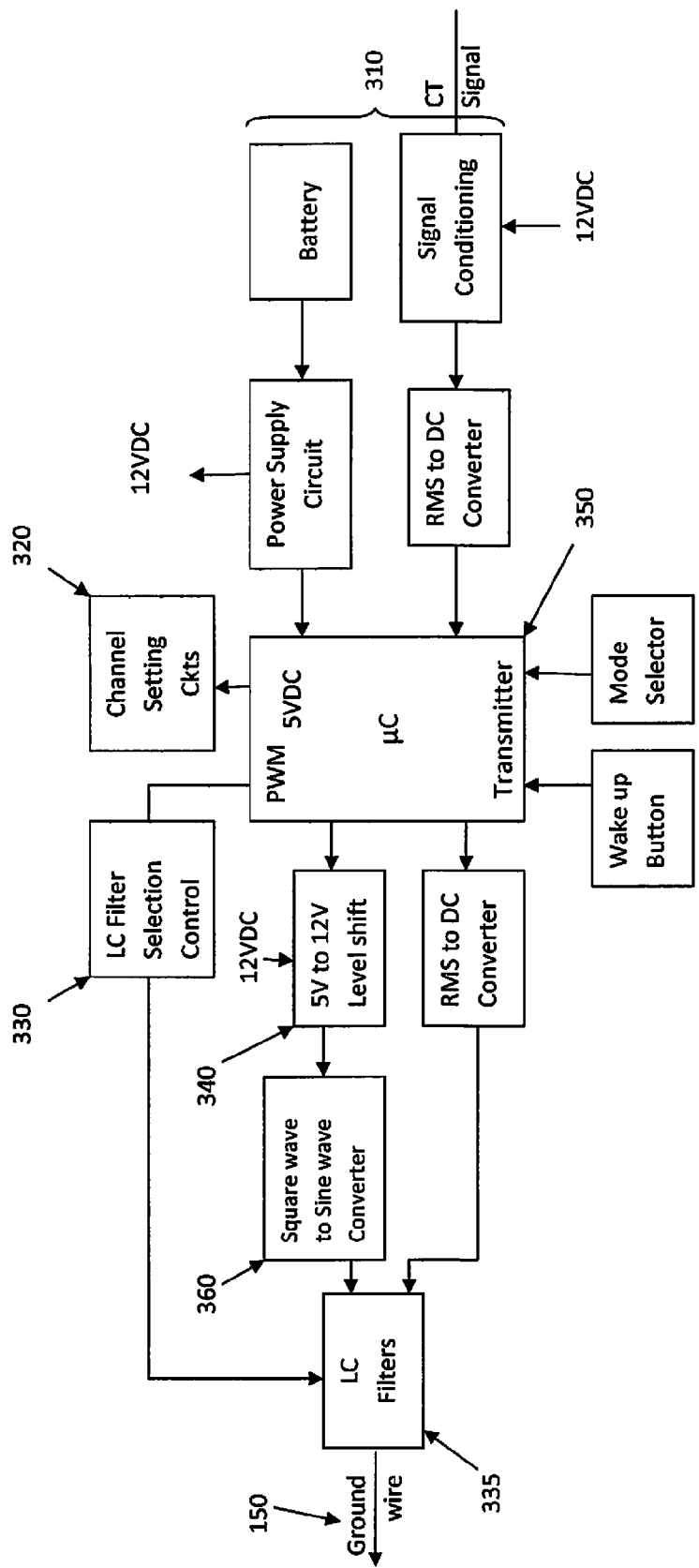
FIG. 3 is a schematic block diagram showing an example of a transmitter side of the tone monitor system.

FIG. 3 is a schematic block diagram showing an example of a receiver assembly of the tone monitor system. As shown, the transmitter assembly power supply circuit 310 uses the current transformer CT signal sensed from a power conductor, or batteries, such as two 16V batteries to generate 5 VDC and 12 VDC power sources. The 5 VDC can be used to supply the microcontroller 350 and its peripheral circuits while the 12 VDC can be used for the interface circuits connected with the ground wire 150 and the current transformer CT. After passing through the signal conditioning circuit and RMS to DC converter, the CT signal is detected for the microcontroller 350 to recognize that the system is powered by CT or batteries.

The channel setting circuit 320 is used for the microcontroller 350 to determine the work channel number and the corresponding operating signal frequency. The channel selector 320 can be a four-position DIP switch for setting the channel number and operating signal frequency corresponding to the channel and a power indicator to show the state of the transmitter. The microcontroller via the LC filter selection control circuit 330 then select 1 of 16 different LC filters 335 to associate with the channel frequency.

The primary function of the transmitter assembly 300 is to transmit the tone monitor signal to the ground wire 150. The microcontroller's PWM pin outputs the square wave at the channel frequency. After crossing the 5V to 12V level shifter 340, the amplitude of the square wave changes to 12V. Once the square wave to sine wave converter 360 turns the square wave into the sine wave, the sine wave at the preselected frequency is transmitted to the ground wire 150 via the selected LC filter 335.

The Channel Setting circuits 210 and 320 in the receiver assembly and transmitter assembly, respectively, are used for the microcontrollers 250 and 350 to determine the work channel number and the corresponding operating signal frequency, then select 1 of 16 LC filters 285 and 335 to associate with this channel frequency.

The receiver assembly primarily receives the transmitted tone monitor signal from the ground wire 150. After processed through the signal conditioning circuit, the CT tone monitor signal arrives at the LC filter. Only the tone monitor signal with the resonant frequency of the selected LC filter passes through the selected LC filter. The RMS signal is converted to DC, and then measured in the microcontroller. According to the measured value, the ground wire resistance is calculated. After the resistance is calculated, the value can be compared to preselected resistance settings or resistance ranges for different fault types. When a fault is detected, the corresponding resistance range indicator and ground wire broken indicator or shorted wire indicator is illuminated and a corresponding status signal is transmitted to the PLC controller module via the available Ethernet interface and the form c relay changes state. The indicator at the receiver (power center) can also include an audible warning signal.

The calculated ground wire resistance can be saved in the external memory every 5 minutes, for up to 24 hours. The saved resistance data can be transferred to PLC via the Ethernet connection, or erased by the microcontroller at the request at PLC. The data can also be read to a USB stick through the USB connector.

The trip event is also stored to the external memory, including the time stamp and trip type such as ground wire broken, shorted ground wire resistance, and the like. For example, up to 2000 events can be recorded depending on the memory storage capacity. The data also can be transferred to a PLC or read to a USB stick. They can only be overridden by subsequent data storage, but cannot be erased.

In an embodiment, the transmitter assembly can include a transmitter wake up button to manually transmit a test signal to the receiver. In this mode, the transmitter assembly transmits the signal to the ground wire after the transmitter wake up pushbutton is depressed. The microcontroller's PWM pin outputs the square wave with the channel frequency. After passing through the 5V to 12V level shifter, the amplitude of the square wave changes to 12V. Once the square wave to sine wave converter converts the square wave into the sine wave, the sine wave is directly transmitted to the ground wire.

The operating status control circuit 240 uses a three-position rotary switch to control the operating status. When the switch is in the Normal position, the selected LC filter is connected to the CT through the CT signal conditioning circuit. When the switch is in Open Test position, the selected LC filter is connected with the ground circuit via a resistor, an approximately 55Ω in this example, and when the switch is in Short Test position, the selected LC filter is connected to the Earth Ground via an approximately 0.47Ω resistor for example. A fault condition would be an OPEN Ground wire or a SHORTED ground wire. If the ground wire is open then the load is ungrounded, unsafe and can cause electrocution in a phase to ground condition. If the ground wire is shorted then the load is grounded through an unmonitored path. This condition could mean intermittently grounding unsafe and can cause electrocution in a phase to ground condition.

The transmitter assembly is installed on the machine, or load, side of the power distribution system, generates the signal and transmits the signal to the ground wire. When the load is on, the transmitter assembly takes power from a power conductor through a current transformer. When the machine power is not available, the transmitter can be supplied by batteries.

Ground connections are extremely important in the underground mining industry. The ground wire on the machine (load) side is connected to the Earth Ground through the power center, which is connected to the Earth Ground upstream at the surface Earth Ground bed. The signal ground of the complete transmitter assembly circuits is floating, and can not be connected to the Earth Ground.

The receiver assembly is installed at or near the power center and is powered by 120 VAC source. The receiver receives the transmitted monitor signal/tone from the ground wire through a monitor current transformer. The receiver assembly is powered from a 120 VAC source. The ground wire near the power center is isolated from the Earth Ground by an ARC TRAP that prevents inter-machine arcing in the event the power center and the load come in contact given the load may be a portable machine.

Figure 5A:
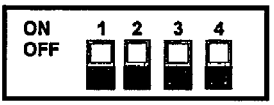
FIG. 5a is a table showing an example of dip switch settings for a tone monitoring system of up to sixteen different tone monitor pairs.
Figure 5A:
Figure 5A:
Figure 5A:
Figure 5A:
Figure 5A:
Figure 5A:
Figure 5A:
Figure 5A:
Figure 5A:
Figure 5A:
Figure 5B:
Figure 5B:
Figure 5B:
Figure 5B:
Figure 5B:

The Tone Monitor pair (one transmitter and one receiver) allows its channel number and corresponding operating signal frequency to be adjusted at installation locally or remotely. These parameters can be set locally by the four-position DIP switches (for each tone monitor pair) on both the transmitter assembly and receiver assembly. In a tone monitor pair, the setting of the transmitter assembly must be the same as that of the receiver assembly. FIGS. 5a and 5b illustrates an example of dip switch settings for a tone monitoring system of up to sixteen different tone monitor pairs.

The frequency setting can include factory default setting such as Channel 1, 2 KHz, and the like.

In the preferred embodiment, the multi-channel tone monitor system includes three (3) operating modes for the transmitter assembly: Initialization Mode, Transmitting Mode; and Sleep Mode.

Operationally, the transmitter assembly is in Initialization Mode every time after power on. The transmitter assembly uses the channel switch setting to determine the work channel number and the corresponding operating signal frequency, then selects the LC filter associated with this signal frequency. After initialization, it goes into Transmitting Mode.

The transmitter assembly is in Transmitting Mode after Initialization Mode, and every time after waking up from Sleep Mode, for the normal monitoring operation. The transmitter assembly keeps transmitting the signal to the ground wire, at the same time, checking to see if the CT signal is available. If the CT signal is detected, the transmitter assembly is supplied by the external power sensed from a power conductor; if not, the system is powered by the batteries.

When the transmitter assembly is powered by the CT signal, the microcontroller works on the normal frequency clock; when the transmitter assembly is driven by the batteries, the microcontroller can switch to the slow frequency clock for energy conservation. When the batteries continuously power the transmitter assembly for 2 hours, the microcontroller can enter Sleep Mode to conserve the battery usage. In the sleep mode, the transmitter assembly stops transmitting, shuts down all operations.

The transmitter assembly will wake up from Sleep Mode after having received the signal via the ground wire, which is sent by the receiver assembly with the same channel number, and then transitions into the Transmitting Mode.

There are two operating modes for the receiver assembly: Initialization Mode; and Receiving Mode. The receiver assembly is in Initialization Mode after every power on event. The receiver assembly uses the channel switch setting to determine the work channel number and the corresponding operating signal frequency, then selects the LC filter corresponding to the assigned operating signal frequency. After initialization, the receiver enters Receiving Mode. In the Receiving Mode, the Form C Relay is de-energized. After completing the Initialization Mode, the receiver assembly stays in Receiving Mode for the normal monitoring operation.

The receiver assembly continuously receives the transmitted signal that is sensed by CT. When received, the receiver assembly measures the RMS value of the received signal sent by the transmitter assembly and then calculates the resistance value of the ground wire according to the measured RMS value. The calculated resistance is compared to a threshold look-up table for the particular ground cable and illuminates the corresponding resistance range indicator or ground wire broken indicator.

The calculated ground wire resistance is stored in the external memory connected with the receiver assembly. For example, every 5 minutes for up to 24 hours before the recorded resistance reading overwrite previous resistance readings. When the calculated ground wire resistance value is greater than the threshold trip resistance value, the tone monitor is dropout; the Form C Relay is de-energized.

When the calculated ground wire resistance value is less than the threshold trip resistance value, the tone monitor is enabled and the Form C Relay is energized. The trip event is stored in the external memory with the time stamp and the trip type. The trip type can be shorted ground wire, high resistance ground wire; or ground wire broken.

The receiver assembly includes an operating status rotary switch to switch between receiver operating functions. When the operating status control rotary switch is in Normal position, the receiver assembly current transformer senses the received signal, processes the signal from current transformer and otherwise performs the normal monitoring function. When the rotary switch is set to the Open Test position, the receiver assembly receives the signal directly from the ground wire via a resistor, a 55Ω resistor in this example, and the tone monitor is dropped out. When the operating status switch is in Short Test position, the receiver assembly receives a signal from the Earth Ground via another resistor, a 0.47Ω resistor in this example, and the tone monitor is tripped.

When the USB Read or Write pushbutton is depressed for over 3 seconds, the receiver assembly performs a firmware self-upgrade or transfers the ground resistance data and trip event records from the external memory to a USB stick. When a read command from PLC is received, the receiver assembly transfers the ground resistance data, or trip event records, or both, from the external memory to the PLC.

When the transmitter wake up pushbutton is depressed and no CT signal is detected, the receiver assembly directly transmits a wake up signal to the ground wire, to wake the transmitter assembly from the sleep mode.

One skilled in the art should realize that the particularities in the tone monitoring system should not be construed as limitation of the preferred embodiment. Various system configurations and corresponding components may be chosen and optimized for a particular application to achieve a desired multi-channel tone monitoring system using ground wire signal transmission to monitor the integrity of the ground circuit of power distribution circuits.

For example, the tone monitor system can use machine recognition (load recognition) where each machine node has a specific digital bit word name. The monitor receives the digital name and verifies the digital name is the same as is in the monitor register allowing it to connect and monitor that particular machine. The monitor also communicates to the monitor channels and other monitors as well as the mine communications infrastructure what monitor/channel is connected to what machine and the resistance of the ground conductor.

The tone monitor system of the present invention is configured to operate in compliance with the Mine Safety and Health Act of 1977 (MSHA).

As previously discussed, the mining electrical system has only one single ground point with all other grounding points daisy chained together. Each ground in the tone monitor system is assigned a different tone (frequency). The system transmits multiple different tones through the grounding wire system and each different tone is received by only one single receiver having an LC filter that matches that particular assigned tone.

Applications using the tone monitor include a standalone pair and up to 16 multi-channel system using two assemblies for each standalone pair: one transmitter assembly and one receiver assembly. The tone monitor system described below is expandable using up to sixteen (16) different operating signal frequencies.

Figure 4:
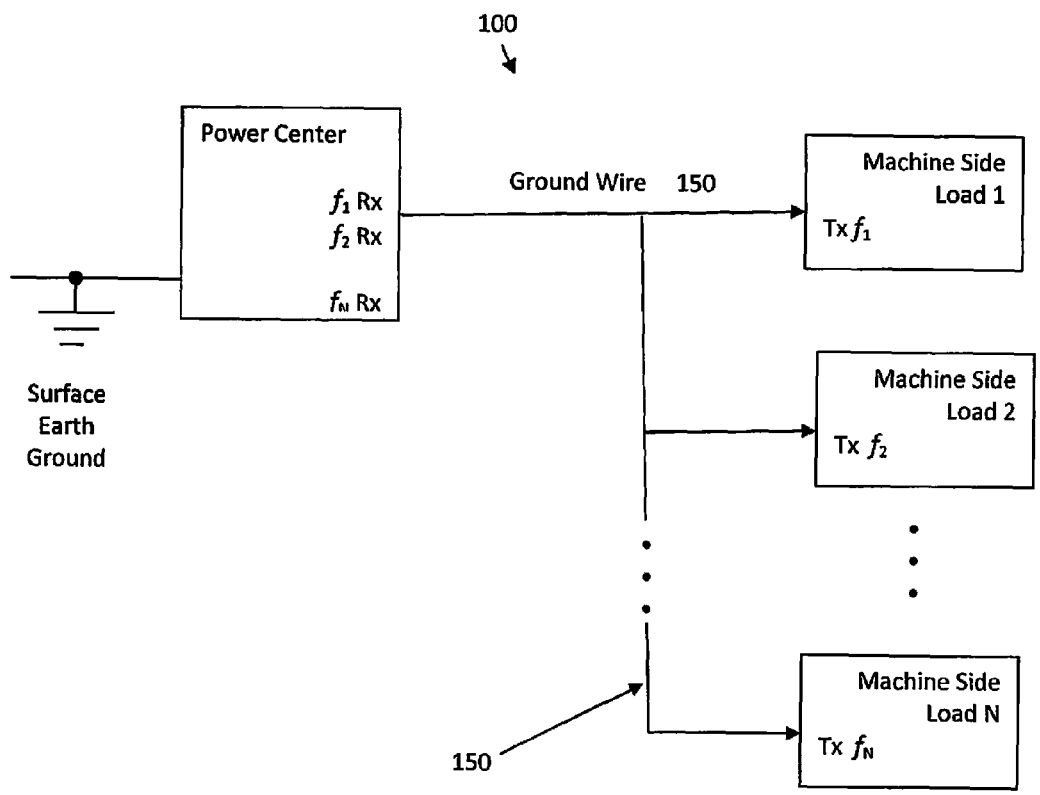
FIG. 4 is a block diagram of a multi-channel ground monitoring system using the tone monitor transmitter and receiver pairs.

In electrical and electronic engineering a daisy chain is a wiring scheme in which multiple devices are wired together in linear series. FIG. 4 is a block diagram of a multi-channel ground monitoring system using the tone monitor transmitter and receivers. As shown, the Receiver assembly is installed on the power center and the ground system includes only one single ground point. The Transmitter assembly is installed on the machine/load side. Each tone monitor pair includes one single receiver and one single corresponding transmitter, both configured for the same monitor signal frequency. Each receiver has a filter, such as a LC filter, that only passes the signals having a frequency corresponding to that particular receiver. Each load side transmits a ground wire monitor signal having a different frequency. At the power center, the corresponding receiver senses the transmitted ground wire monitor signal.

Alternatively, the multi-channel ground wire monitor system uses load recognition with multiple different tone monitor pairs each having a receiver assembly and a transmitter assembly each set to transmit and receive a different digital bit word code and one single grounding wire system connected between the multiple receiver assemblies and the multiple transmitter assemblies such that the different digital bit word codes are transmitted via the one single grounding wire system.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

I claim:

1. An open loop ground wire tone monitor comprising:
   a transmitter assembly connectable with one single electrical distribution system ground wire to inject a ground monitor signal onto the ground wire at intervals, the transmitter assembly including a first channel selection, locally or remotely controlled with each channel corresponding to a preset channel frequency and plural output filters each corresponding to one of the channel frequencies, the transmitter assembly automatically activating the one of plural filters corresponding to the selected channel frequency to pass the ground wire monitor signal of the selected channel frequency onto the ground wire; and
   a receiver assembly connectable to an opposite end of the one single electrical distribution system ground wire and a current transformer coupled with the ground wire to sense the transmitted ground monitor signal, the receiver assembly having a second channel selection switch for selecting the channel set at the transmitter assembly and plural input filters each corresponding to one of the channels, the transmitter assembly automatically activating the input filter corresponding to the set channel to pass the received ground monitor signal to the receiver microcontroller to calculate a ground wire resistance from the received ground monitor signal and outputting a ground wire status signal based on the calculated resistance.

2. The tone monitor of claim 1, wherein the filter is a phase filter.

3. The tone monitor of claim 1, wherein the filter is an inductor/capacitor filter.

4. The tone monitor of claim 1, further comprising:
   an indicator to indicate the status of the ground wire.

5. The ground wire tone monitor of claim 4 further including one or more of a resistance range indicator, shorted ground wire indicator, and a ground wire broken indicator.

6. The ground wire tone monitor of claim 1 wherein the first and second channel selector switches are a four position DIP switch for selecting one of sixteen different channels.

7. The ground wire tone monitor of claim 1 wherein each one of the filters passes resonant frequencies of the selected channel frequency.

8. The ground wire tone monitor of claim 1 further including an Ethernet connection for communicating ground wire status and controlling channel frequency selection with a remotely located controller.

9. The ground wire tone monitor of claim 1, further including a fault relay connected with the receiver assembly for automatically opening a relay to disconnect electrical power when a fault is detected.

10. A multi-channel ground wire monitor system comprising:
    multiple different tone monitor pairs each having a receiver assembly and a transmitter assembly, each one of the multiple tone monitor pairs set to transmit and receive a different frequency tone monitor signal; and
    one single grounding wire system connected between the multiple receiver assemblies and the multiple transmitter assemblies such that the multiple frequency tone monitor signals are transmitted via the one single grounding wire system.

11. The multi-channel ground wire monitor system of claim 10 wherein each one of the multiple receivers and transmitters include a microcontroller.

12. The multi-channel ground wire monitor system of claim 11 each tone monitor pair comprising:
    a transmitter channel frequency selector switch connected to the transmitter microcontroller for selecting a ground wire monitor frequency and injecting the ground wire monitor signal with the selected frequency on the one single ground wire; and a receiver channel frequency selector switch connected to the receiver microcontroller for selecting a same ground wire monitor frequency and receiving only the ground wire monitor signal with the selected frequency from the one single ground wire, wherein each channel of the transmitter and receiver channel frequency selector switch corresponds to a different tone monitor frequency.

13. The multi-channel ground wire monitor system of claim 12 wherein the receiver assembly includes:

multiple selectable filters embedded in each one of the transmitters and receivers, each filter activated by the microcontroller to passing only the tone monitor signal at the selected frequency.

14. The multi-channel ground wire monitor system of claim 10 wherein each one of the receiver assemblies includes:

a current transformer coupled with the ground wire for sensing the tone monitor signals wherein the receiver filter only passes the received tone monitor signal at only a fundamental frequency of the selected channel frequency.

15. The multi-channel ground wire monitor system of claim 10 further comprising:

an indicator to indicate the status of the ground wire.

16. The multi-channel ground wire monitor system of claim 15 wherein the indicator includes one or more resistance range indicators, shorted ground wire indicator, and a ground wire broken indicator.

17. The multi-channel ground wire monitor system of claim 10 further comprising:

a fault relay connected with the receiver assembly for automatically opening a relay to disconnect electrical power when a fault is detected.

18. The multi-channel ground wire monitor system of claim 10 wherein the one single grounding wire system has only one single ground point with ground points daisy chained together.

19. An open loop ground wire monitoring system comprising:

a power distribution unit for distributing a power to two or more different loads;

an electrical system connecting the power distribution unit and the two or more loads, the electrical system having a ground wire system with only one single ground point, and two or more load grounding points daisy chained to the two or more loads;

two or more tone monitor pairs each consisting of a transmitter assembly at one of the two or more loads and a receiver assembly at the power distribution unit, each tone monitor pair assigned a different tone (frequency), the ground wire monitoring system transmitting two or more different tones injected by the two or more transmitter assemblies through the grounding wire system and each different tone is received by only one single receiver assembly.

20. A multi-channel ground wire monitor system using load recognition comprising:

multiple different tone monitor pairs each having a receiver assembly and a transmitter assembly, each one of the multiple tone monitor pairs set to transmit and receive a different digital bit word code; and one single grounding wire system connected between the multiple receiver assemblies and the multiple transmitter assemblies such that the different digital bit word codes are transmitted via the one single grounding wire system.

* * * * *